United States Patent
Chen et al.

(10) Patent No.: US 6,417,096 B1
(45) Date of Patent: Jul. 9, 2002

(54) METHOD FOR AVOIDING PHOTO RESIDUE IN DUAL DAMASCENE WITH ACID TREATMENT

(75) Inventors: Anseime Chen; Jun Maeda, both of Hsin-Chu; Sheng-Yueh Chang, Taipei; Sung-Hsiung Wang, Kaohsiung, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/611,738

(22) Filed: Jul. 7, 2000

(51) Int. Cl.$^7$ .................................... H01L 21/4763
(52) U.S. Cl. ................. 438/637; 438/624; 438/634; 430/317
(58) Field of Search ................. 438/689, 637, 438/761, 638, 701, 713, 640, 978, 618, 624, 626, 629, 634, 666, 667, 668, 669, 672, 675, 906; 430/312–314, 316, 317

(56) References Cited

U.S. PATENT DOCUMENTS

| | | | |
|---|---|---|---|
| 5,989,997 A | * 11/1999 | Lin et al. | 438/622 |
| 6,004,729 A | * 12/1999 | Bae et al. | 430/317 |
| 6,025,259 A | * 2/2000 | Yu et al. | 438/618 |
| 6,127,263 A | * 10/2000 | Parikh | 438/637 |
| 6,146,986 A | * 11/2000 | Wagganer | 438/618 |
| 6,194,128 B1 | * 2/2001 | Tao et al. | 430/313 |
| 6,211,092 B1 | * 4/2001 | Tang et al. | 438/719 |
| 6,242,344 B1 | * 6/2001 | Koh et al. | 438/638 |
| 6,268,283 B1 | * 7/2001 | Huang | 438/638 |
| 6,278,147 B1 | * 8/2001 | Dalton et al. | 257/295 |

* cited by examiner

Primary Examiner—Matthew Smith
Assistant Examiner—Craig P. Lytle
(74) Attorney, Agent, or Firm—Powell, Goldstein, Frazer & Murphy, LLP

(57) ABSTRACT

A substrate is provided. A first dielectric layer is formed over the substrate by deposition. Etching stop layer and a second dielectric layer are formed in turn over the first dielectric. Next, the second dielectric layer is dealt with Lewis acid. Then, a first photoresist layer is defined and formed over the second dielectric layer. And then dry etching is carried out by means of the first photoresist layer as the mask to form a via hole. The surface of the second dielectric layer and the via hole are treated with Lewis acid. Subsequently, the second photoresist layer is defined and formed on the second dielectric layer. Dry etching is proceed, and etching stop layer is as a etching terminal point to remove exposed partial surface of the second dielectric layer so as to form a trench having larger horizontal size than the via hole. Subsequently, the second photoresist layer is removed to form the opening of the damascene.

20 Claims, 14 Drawing Sheets

METHOD FOR AVOIDING PHOTO RESIDUE IN DUAL DAMASCENE WITH ACID TREATMENT

BACKGROUND OF THE INVENTION

1. Field of the Invention

The present invention relates generally to a method for manufacturing the multi level interconnects of semiconductor devices, and more particularly to avoid photo residue on the dual damascene process.

2. Description of the Prior Art

When semiconductor devices of integrated circuit (IC) become highly integrated, the surface of the chips can be not supplied with enough area to make the interconnects. For matching up the requirement of interconnects increase with Complementary Metal-Oxide-Semiconductor (CMOS) devices shrinks, many designs of the integrated circuit have to use dual damascene method. Moreover, it is using the three-dimensional structure of multi-level interconnects at present in the deep sub-micron region, and inter-metal dielectric (IMD) as the dielectric material which be used to separate from each of the interconnects. A conducting wire which connects up between the upper and the down metal layers is called the via plug in semiconductor industry. In general, if an opening which forms in the dielectric layer exposure to devices of the substrate in interconnects, it is called a via.

According to particular of the process, it will compartmentalize three types, such as the single type, the dual type and the self-aligned type. The damascene is that etch the trench of interconnects in the dielectric, and then fill the metal as interconnect. This method can introduce metal that is difficult etched into the semiconductor without etching in the interconnect process. Therefore, this invention is the best method of the interconnect process in the sub-quarter micron.

Conventional dual damascene is as shown in FIG. 1A, first of all, a dielectric 12 is formed over on the substrate 10, and a etching stop layer 14 is formed over on the dielectric 12, then a dielectric 16 is formed over on the etching stop layer 14. And then a photoresist layer 18 is formed on the dielectric 16, then the photoresist layer 18 is patterned as a deep pattern area. As show in FIG. 1B, dry etching of the deep patterns is proceeded by means of the photoresist layer 18 as a mask, then punch through the dielectric 16, etching stop layer 14 and the dielectric 12, and forming a via hole, then remove the photoresist layer 18. As show in FIG. 1C, a photoresist layer 22 is formed on the dielectric 16 by deposition, and it is defined to form a shallow pattern area, and the partial surface of the via 20 and the dielectric 16 are exposed, likewise, the horizontal size of the shallow patterns is large more then one of the deep patterns. As show in FIG. 1D, dry etching of the shallow patterns is proceed by means of the photoresist layer 22 as a mask, and exposed partial surface of the dielectric 16 is removed to form a trench 24 having large horizontal size to take advantage of etching stop layer 14 is as a etching terminal point. As show in FIG. 1E, the photoresist layer 22 is removed to form the opening of the damascene 20, 24. Final, proceed a interconnect process, since the above processes are well known in the prior art, which are not the focus of the present invention, hence will not be described in greater details.

The skill of the dual damascene is a method for forming the via and the interconnects. For the dual damascene application, the material of the dielectric layer general use low-K material. The low-K dielectric material is popular to apply copper (Cu) dual damascene process to decrease resistance capacitance (RC) delay time of interconnect material below 0.13 um generation, the cause of the resistance capacitance (RC) delay time is due to result the parasitic capacitance from the inter-metal dielectric layer. But the residue is found on low-K material (such as coral, black-diamond, etc) surface and in via side wall after develop because some low-K material was reactive with photo resist. The residue would induce fence in via or big defect on low-K material surface after etch. The issue would induce short between metal.

In the dual damascene process, the organic bottom anti-reflection coating, polymer as gap-filling material and deposition protect material was applied this process which increase cost and complex process. Some low-K material still having fence or residue after using gap-filling material, and deposition protect material is difficult to find without increase K value.

In conventional dual damascene process, the photoresist is put on the surface of the low-K material before expose via (via first process) or trench (trench first process). The residue will be observed on exposure area, as shown in FIG. 4A. The root cause of photo residue 400 is combined several chemical reaction between low-K material and photoresist.

The photoresist residue 510 will remain on the sidewalls of the trench after conventional pattern process, as shown in FIG. 5A. Thereby, the fence 520 that affects the quality of the process will be happened after trench etching as shown in FIG. 5B.

In accordance with the above description, a new and improved method for avoiding photo residue on the dual damascene process is therefore necessary, so as to raise the yield and quality of the follow-up process.

SUMMARY OF THE INVENTION

In accordance with the present invention, a method is provided for avoiding photo residue on the dual damascene process that substantially overcomes drawbacks of above mention problems arose from the conventional methods.

Accordingly, it is an object of the present invention to provide a method for avoiding photo residue on the dual damascene process, the present invention deal the surface of the low-K dielectric material that has been exposed with acid, the surface that has been dealt with acid will not react with the photoresist layer. Namely, the cause of the residue can be avoided by acid treatment before the trench pattern, so as to solve the above issue.

The other object of the present invention is that provide a method for avoiding photo residue on the dual damascene process, the present invention deal the surface of the low-K dielectric material that has been exposed with acid, so as to prevent the low-K dielectric layer is destroyed while the photoresist layer and photo residue are being removed. Thus, the method of the present invention is effective in raising quality of the process.

Another object of the present invention is that provide a method for avoiding photo residue on the dual damascene process, and the present method is a simply process that is applied to solve above issue than gap-filling material on trench or deposit protect material on trench and via. The method is lowest cost than add gap-filling material and deposit protect material. Thus, the method of the present invention is easily and to conform to the economic effect, and it is suitable for use in the sub micron.

A further object of the present invention is that provide a acid solvent, the acid solvent is dilute solution like as Lewis acid (such as $H_2SO_4$, DHF, HCL) that is easy to induce $H^+$ ions in solution.

In accordance with the present invention, a method for avoiding photo residue on the dual damascene process is disclosed. In one embodiment of the present invention, a substrate is provided. A first dielectric layer is formed over the substrate by deposition. Etching stop layer and a second dielectric layer are formed in turn over the first dielectric by deposition. Next, the second dielectric layer is dealt with Lewis acid. Then, a first photoresist layer is defined and formed over the second dielectric layer that is treated with Lewis acid. And then dry etching is carried out by means of the first photoresist layer as the mask, and punch through in turn the second dielectric layer, the etch stop layer and the first dielectric layer to form a via hole. Then, the first photoresist layer is removed. The surface of the second dielectric layer and the via hole are treated with Lewis acid. Subsequently, the second photoresist layer is formed on the second dielectric layer, and the photoresist layer is defined to form a shallow pattern area and to expose the partial surface of the via hole and the second dielectric layer. Dry etching of the shallow patterns is proceed by means of the photoresist layer as a mask, and etching stop layer is as a etching terminal point to remove exposed partial surface of the second dielectric layer so as to form a trench having larger horizontal size than the via hole. Subsequently, the second photoresist layer is removed to form the opening of the damascene. Final, proceed a interconnect process, since the above processes are well known in the prior art, which are not the focus of the present invention, hence will not be described in greater details.

In another embodiment of the present invention, a substrate is provided. A first dielectric layer is formed over the substrate by deposition. Etching stop layer and a second dielectric layer are formed in turn over the first dielectric by deposition. Next, the second dielectric layer is dealt with Lewis acid. Then, a first photoresist layer is defined and formed over the second dielectric layer that is treated with Lewis acid. And then dry etching is carried out by means of the first photoresist layer as the mask, and etching stop layer is as a etching terminal point to remove exposed partial surface of the second dielectric layer so as to form a trench. Then, the first photoresist layer is removed. The surface of the second dielectric layer and the trench are treated with Lewis acid. Subsequently, the second photoresist layer is defined and formed on the second dielectric layer, Dry etching is proceed by means of the second photoresist layer as a mask to form a via hole having smaller horizontal size than the trench. Subsequently, the second photoresist layer is removed to form the opening of the damascene. Final, proceed a interconnect process, since the above processes are well known in the prior art, which are not the focus of the present invention, hence will not be described in greater details.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Although specific embodiments have been illustrated and described, it will be obvious to those skilled in the art that various modifications may be made without departing from what is intended to be limited solely by the appended claims.

Figure 1A:
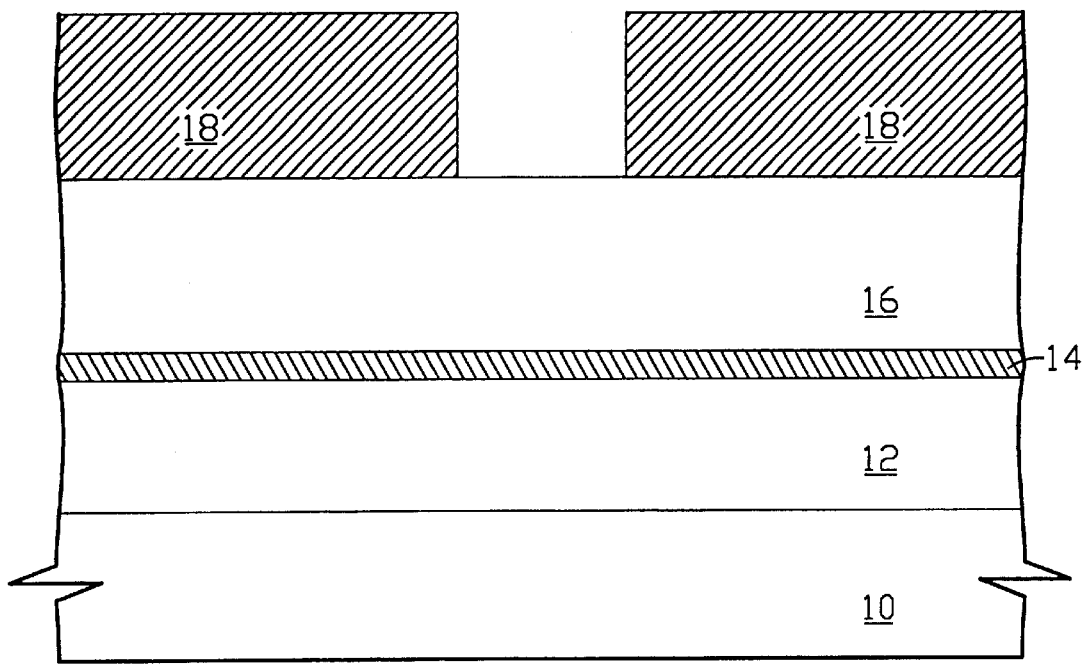
FIGS. 1A to 1E show cross-sectional views illustrative of various stages of conventional dual damascene process.
Figure 1B:
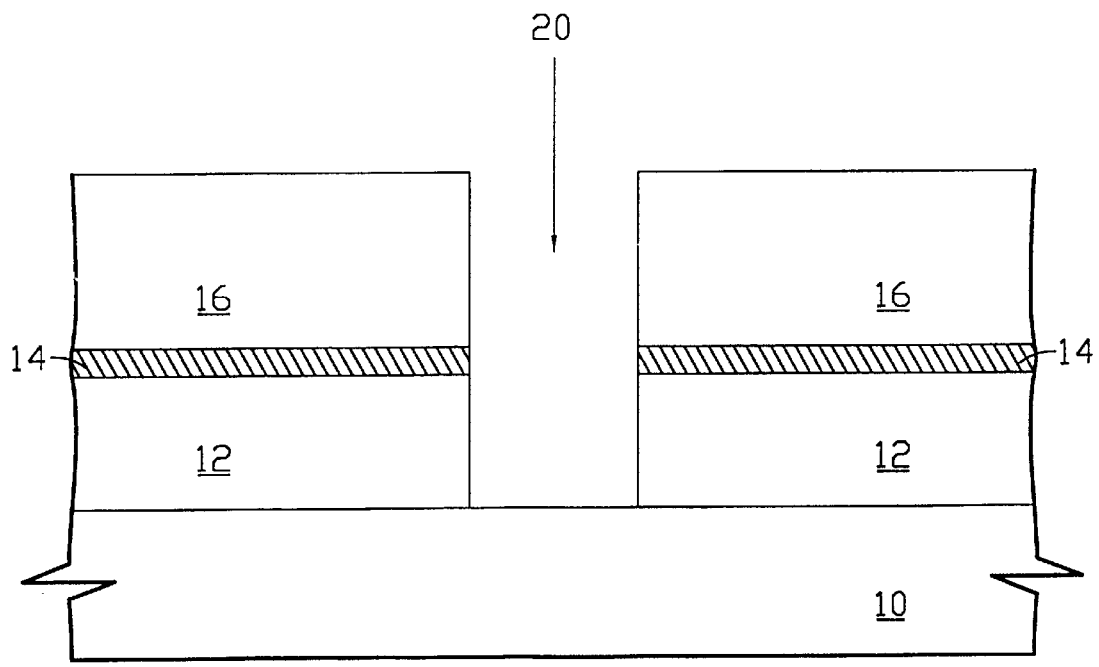
Figure 1C:
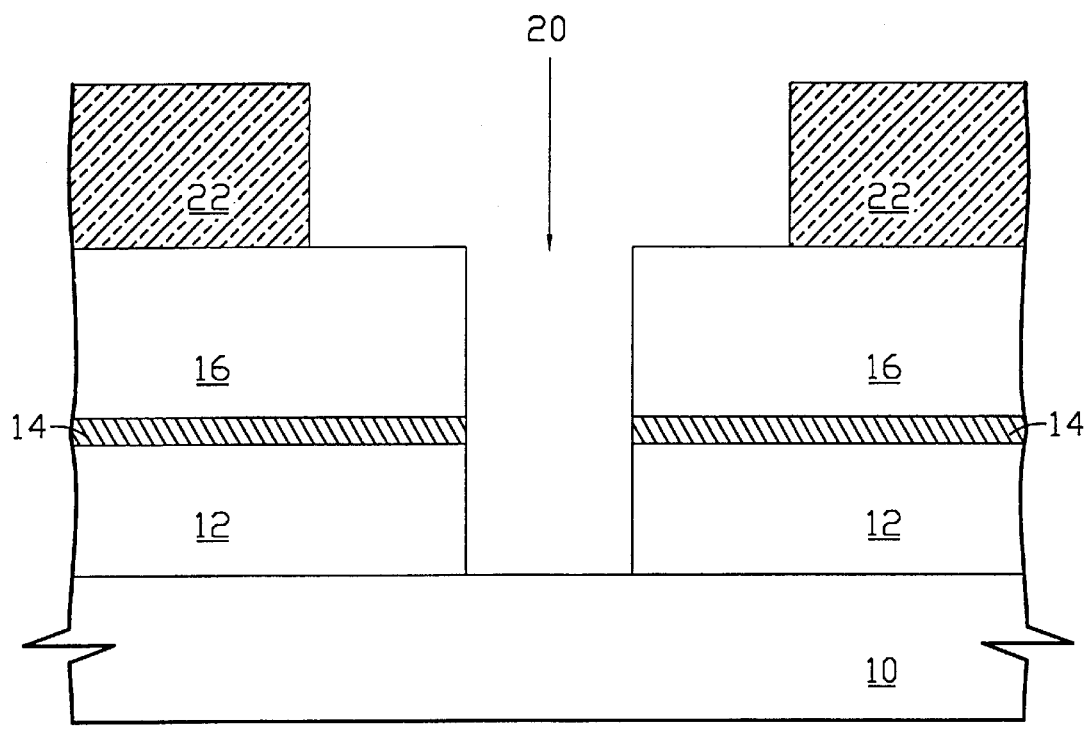
Figure 1D:
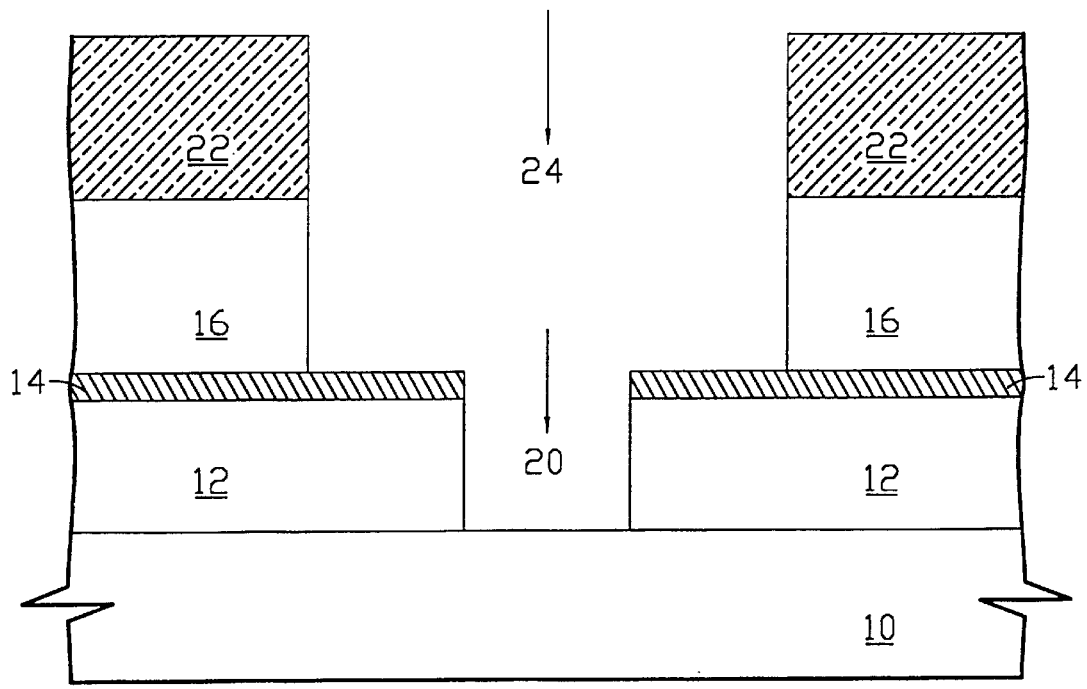
Figure 1E:
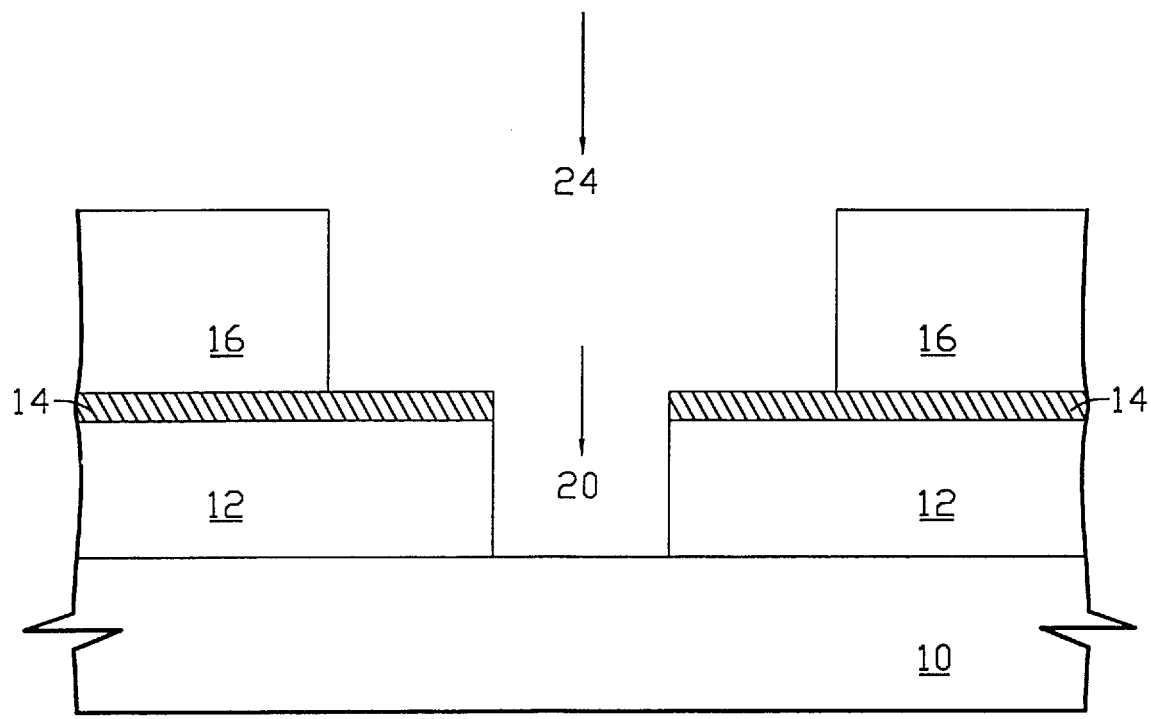
Figure 2A:
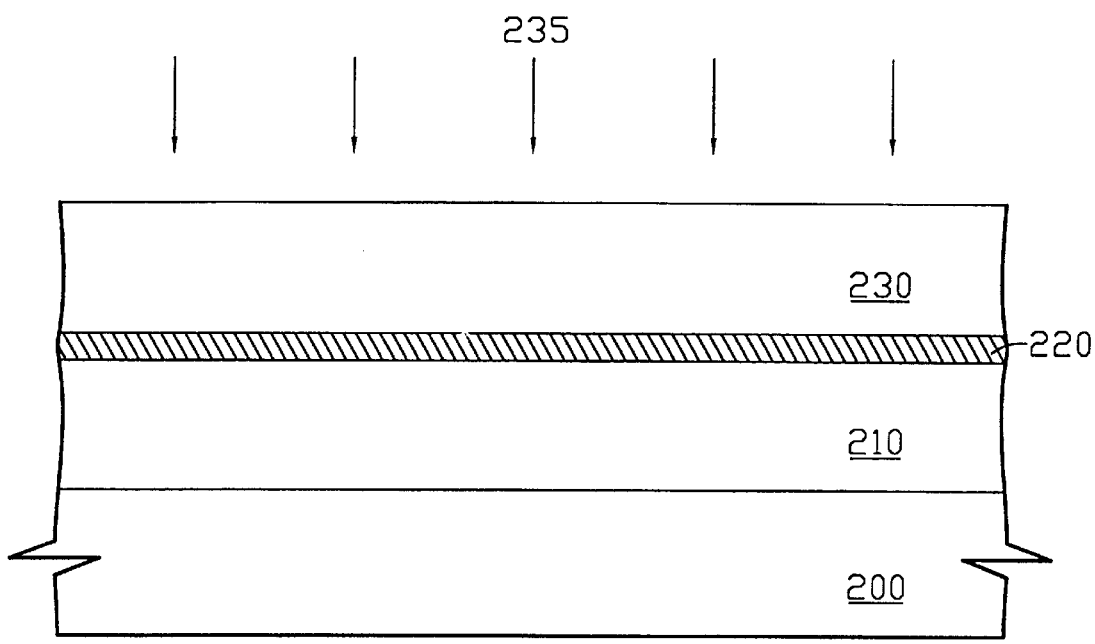
FIGS. 2A to 2E show cross-sectional views illustrative of various stages for avoiding photo residue on the dual damascene process in accordance with one embodiment of the present invention.

As illustrated in FIG. 2A, in this embodiment, a substrate 200 is provided. First, a first dielectric layer 210 is formed over the substrate 200 by deposition, and a etching stop layer 220 and a second dielectric layer 230 are formed in turn over the first dielectric 210. Then, the surface of the second dielectric layer 230 is treated with Lewis acid 235. In this embodiment, the better material of the first dielectric layer 210 is composed of organic low-K material or inorganic low-K material such as Coral, Black-dimond, and HSG . . . etc, wherein the organic low-K material or inorganic low-K material have bonding structure such as amine, imine, hydroxyimine, tetrahydroxy silane, hydroxy silane . . . etc, and the better material of the second dielectric layer 230 is composed of organic low-K material or inorganic low-K material such as Coral, Black-dimond, and HSG . . . etc, wherein the organic low-K material or inorganic low-K material have bonding structure such as amine, imine, hydroxyimine, tetrahydroxy silane, hydroxy silane . . . etc, and the better material of the etching stop layer 220 is such as SiN, SiON, SiC . . . etc. The first dielectric layer 210 has a dielectric coefficient less than 3, and second dielectric layer 230 has a dielectric coefficient to be less than 3 herein.

Figure 2B:
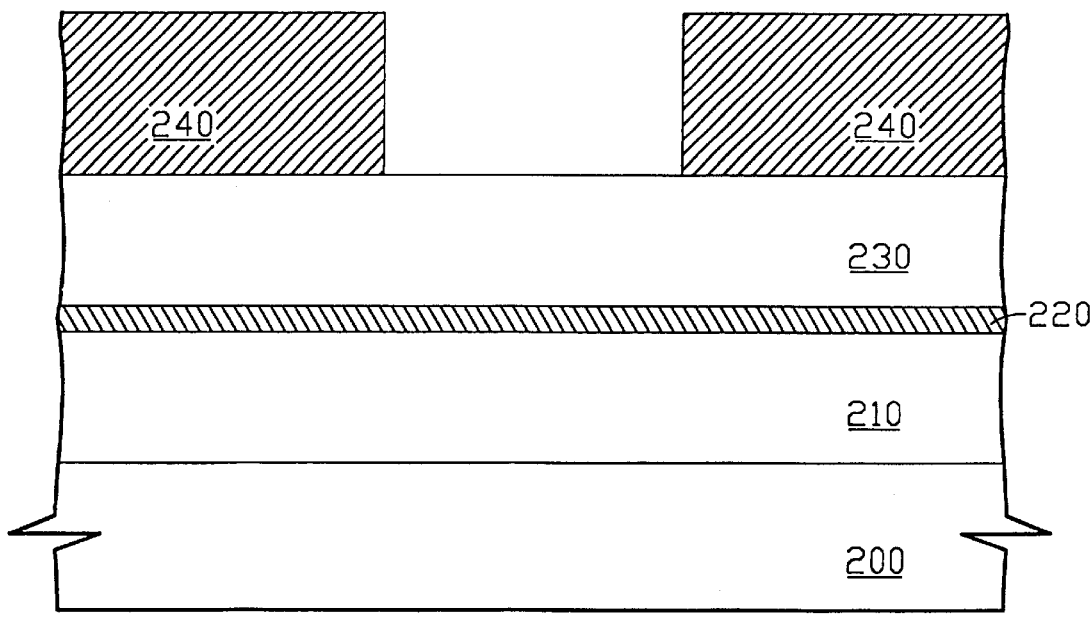

Referring to FIG. 2B, in this embodiment, a first photoresist layer 240 is formed over the second dielectric layer 230 that is treated with acid, and defining the first photoresist layer 240 to be a deep pattern area.

Figure 2C:
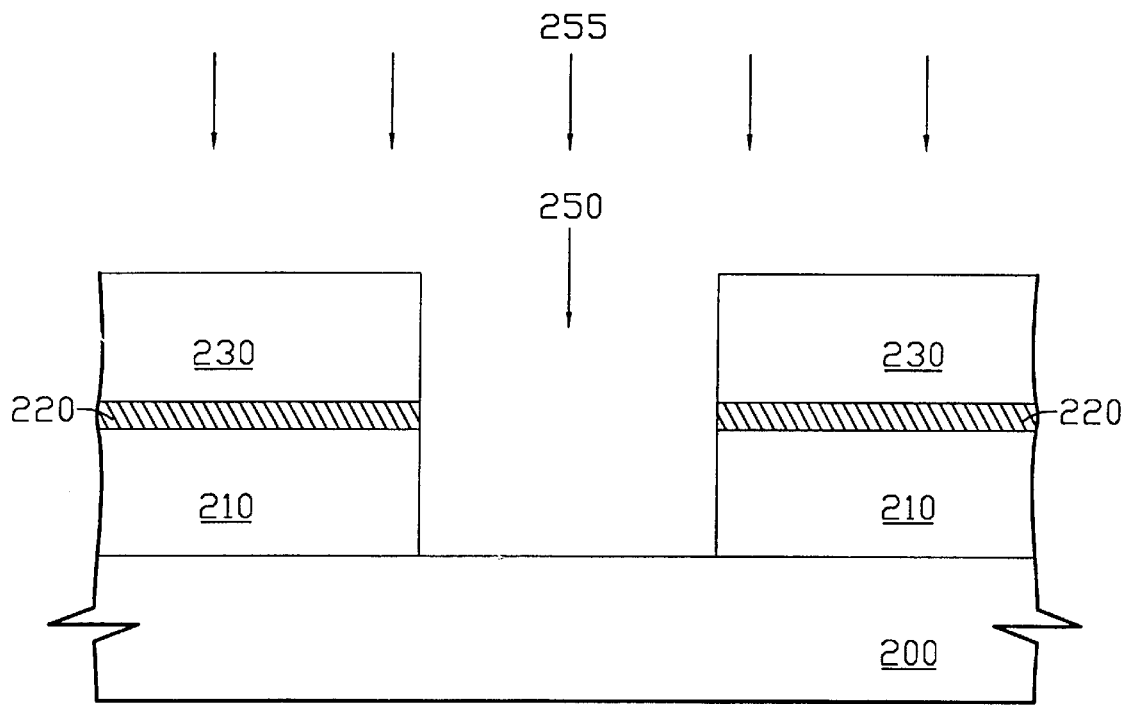

Referring to FIG. 2C, in this embodiment, Dry etching of the deep pattern is carried out by means of the first photoresist layer 240 as the mask, and punch through in turn the second dielectric layer 230, the etch stop layer 220 and the first dielectric layer 210 to form a via hole 250, then, the first photoresist layer 240 is removed. Then, the surface of the second dielectric layer 230 and the via hole 250 are treated with Lewis acid 255.

Figure 2D:
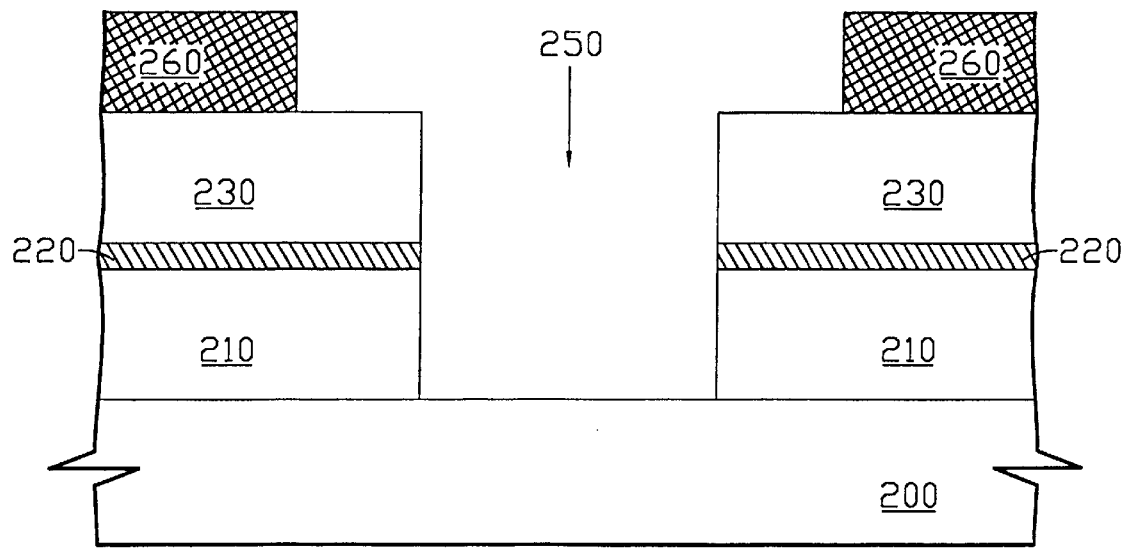

Referring to FIG. 2D, in this embodiment, a second photoresist layer 260 is formed on the second dielectric layer 230, and the second photoresist layer 260 is defined to form a shallow pattern area and to expose the via hole 250 and the partial surface of the second dielectric layer 230.

Figure 2E:
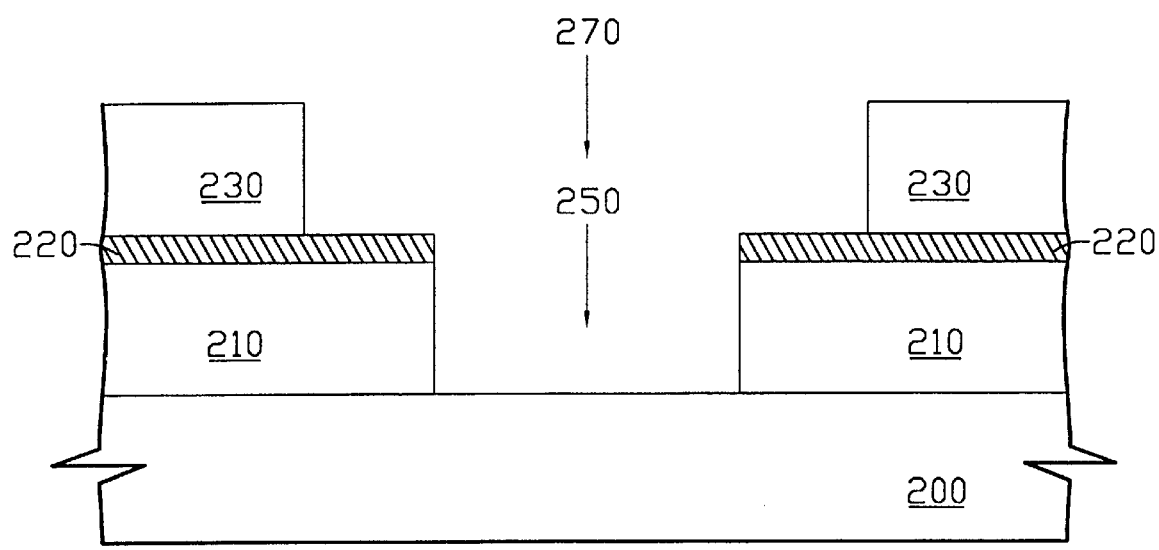

Referring to FIG. 2E, in this embodiment, carrying out a dry etching process by using the second photoresist layer 260 as a mask, and etching stop layer 220 being as an etching terminal point to remove exposed partial surface of the second dielectric layer 230 so as to form a trench 270 having larger horizontal size than the via hole 270. Then, the second photoresist layer 260 is removed to form an opening of the damascene.

Figure 3A:
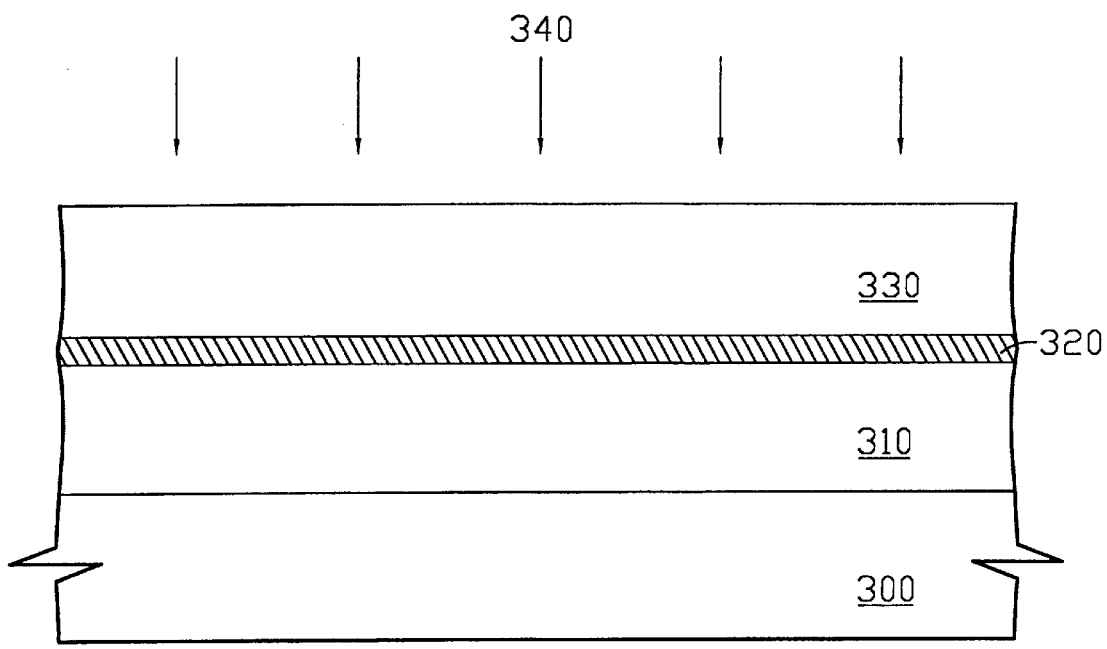
FIGS. 3A to 3E show cross-sectional views illustrative of various stages for avoiding photo residue on the dual damascene process in accordance with one embodiment of the present invention.

Referring to FIG. 3A, in this embodiment, a substrate 300 is provided. First, a first dielectric layer 310 is formed over the substrate 300 by deposition, and a etching stop layer 320 and a second dielectric layer 330 are formed in turn over the first dielectric 310. Then, the surface of the second dielectric layer 330 is treated with Lewis acid 340. In this embodiment, the better material of the first dielectric layer 310 is composed of organic low-K material or inorganic low-K material such as Coral, Black-dimond, and HSG . . . etc, wherein the organic low-K material or inorganic low-K material have bonding structure such as amine, imine, hydroxyimine, tetrahydroxy silane, hydroxy silane . . . etc, and the better material of the second dielectric layer 330 is composed of organic low-K material or inorganic low-K material such as Coral, Black-dimond, and HSG . . . etc, wherein the organic low-K material or inorganic low-K material have bonding structure such as amine, imine, hydroxyimine, tetrahydroxy silane, hydroxy silane . . . etc, and the better material of the etching stop layer 320 is such as SiN, SiON, SiC . . . etc. The first dielectric layer 310 has a dielectric coefficient less than 3, and second dielectric layer 330 has a dielectric coefficient to be less than 3 herein.

Figure 3B:
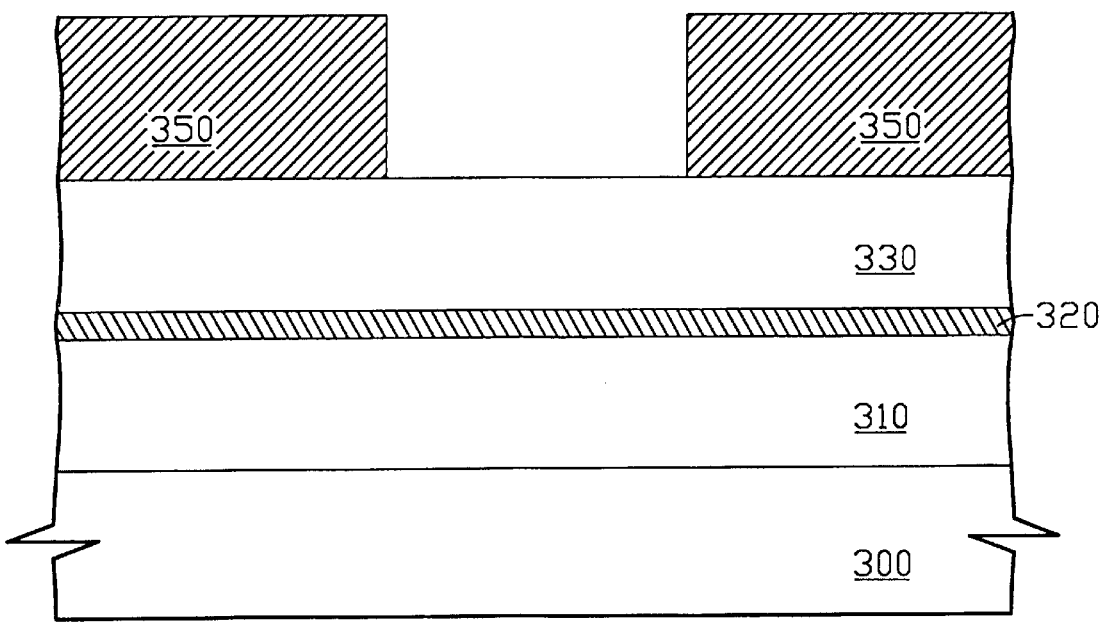

Referring to FIG. 3B, in this embodiment, a first photoresist layer 350 is formed over the second dielectric layer 330 that is treated with acid, and defining the first photoresist layer 350 to be a shallow pattern area.

Figure 3C:
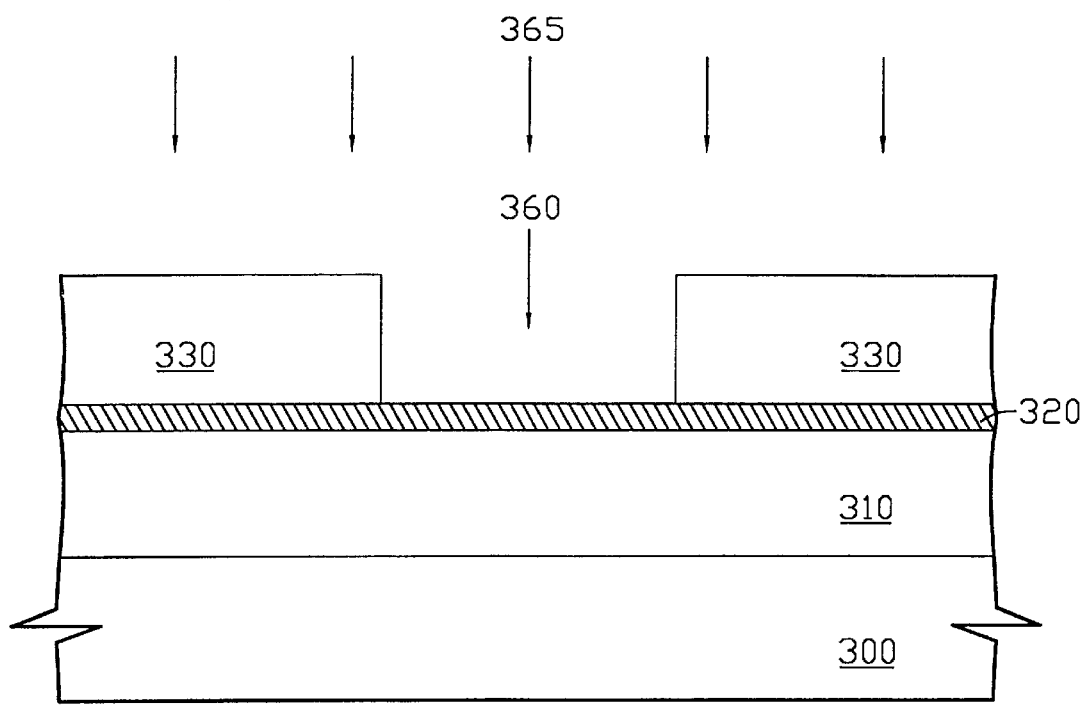

Referring to FIG. 3C, in this embodiment, Dry etching of the shallow pattern is carried out by means of the first photoresist layer 350 as the mask, and etching stop layer 320 being as an etching terminal point to remove exposed partial surface of the second dielectric layer 330 so as to form a trench 360. Then, the first photoresist layer 350 is removed, and the surface of the second dielectric layer 330 is treated with Lewis acid 360.

Figure 3D:
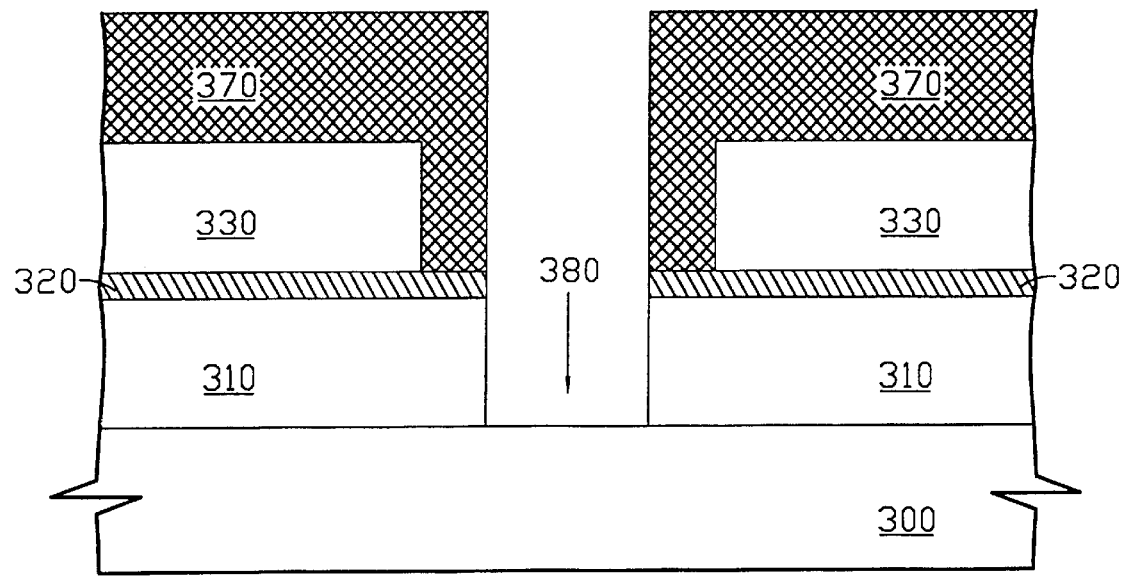
Figure 3E:
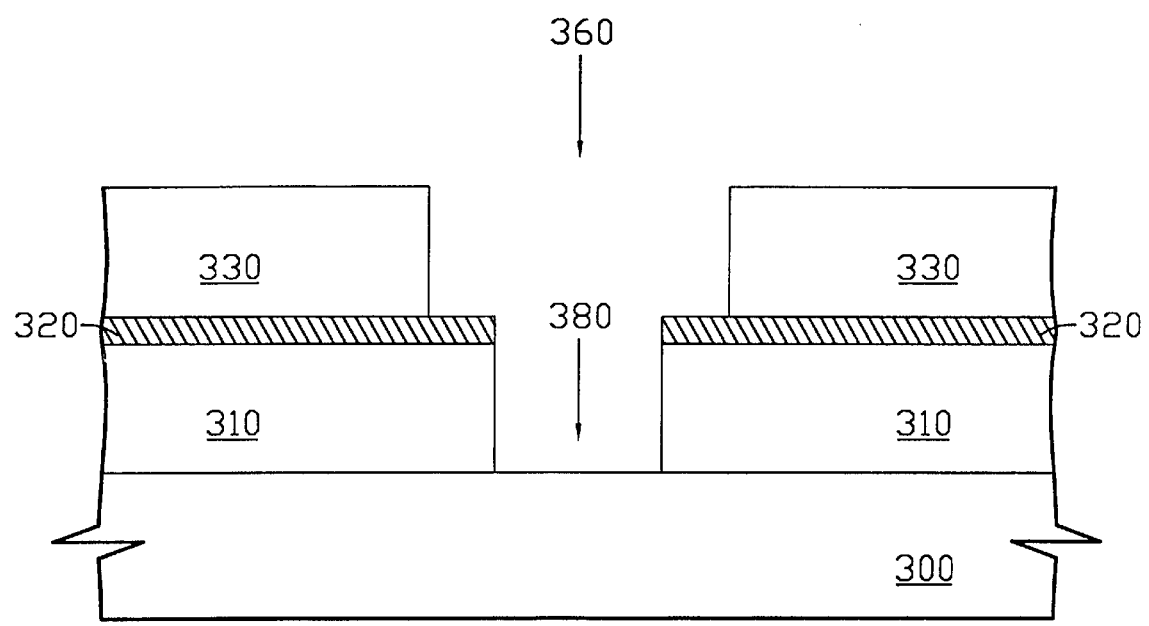

Referring to FIG. 3D, in this embodiment, a second photoresist layer 370 is formed on the second dielectric layer 330, and the second photoresist layer 370 is defined to form a deep pattern area. Carrying out a dry etching process by using the second photoresist layer 370 as a mask, and punch through in turn the etch stop layer 320 and the first dielectric layer 310 to form a via hole 380 having smaller horizontal size than the trench 360. Then, the second photoresist layer 260 is removed to form an opening of the damascene, as shown in FIG. 3E.

Figure 4A:
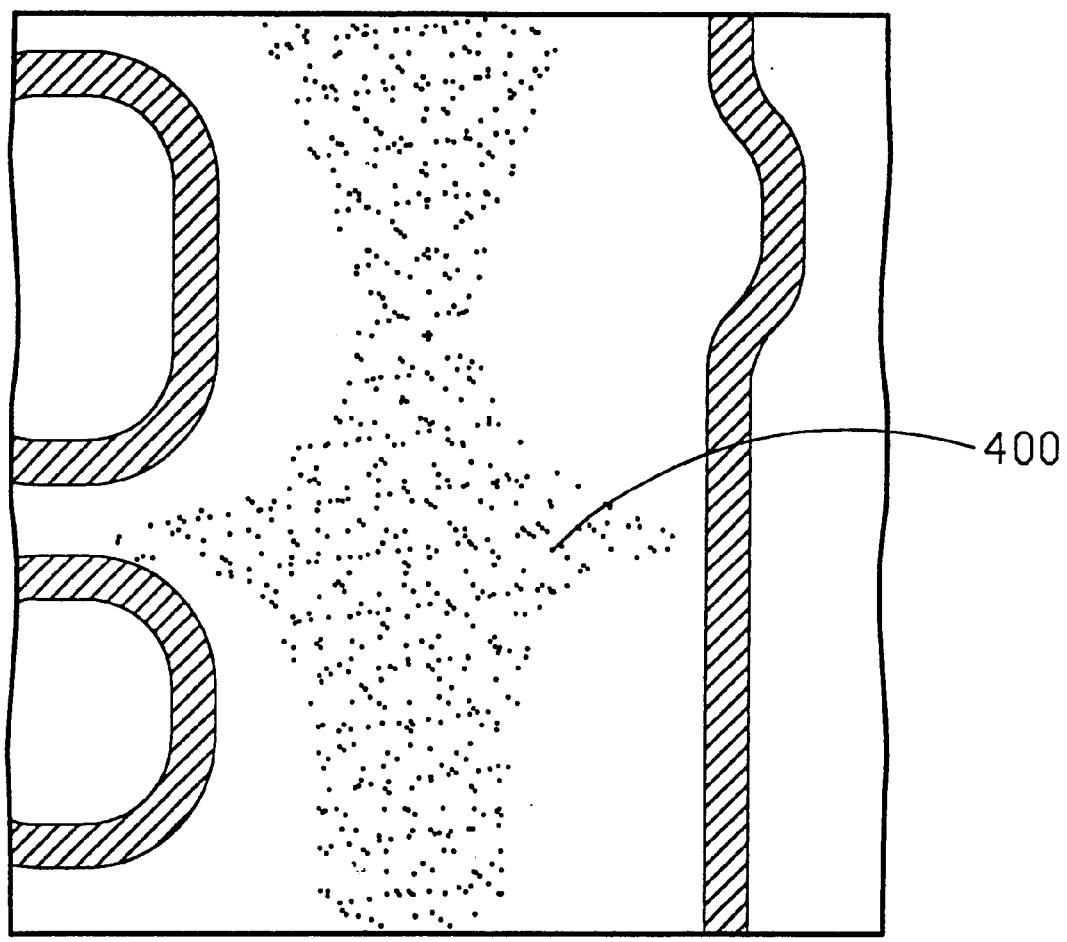
FIG. 4A show illustrative of photoresist residue on the exposure area.
Figure 4B:
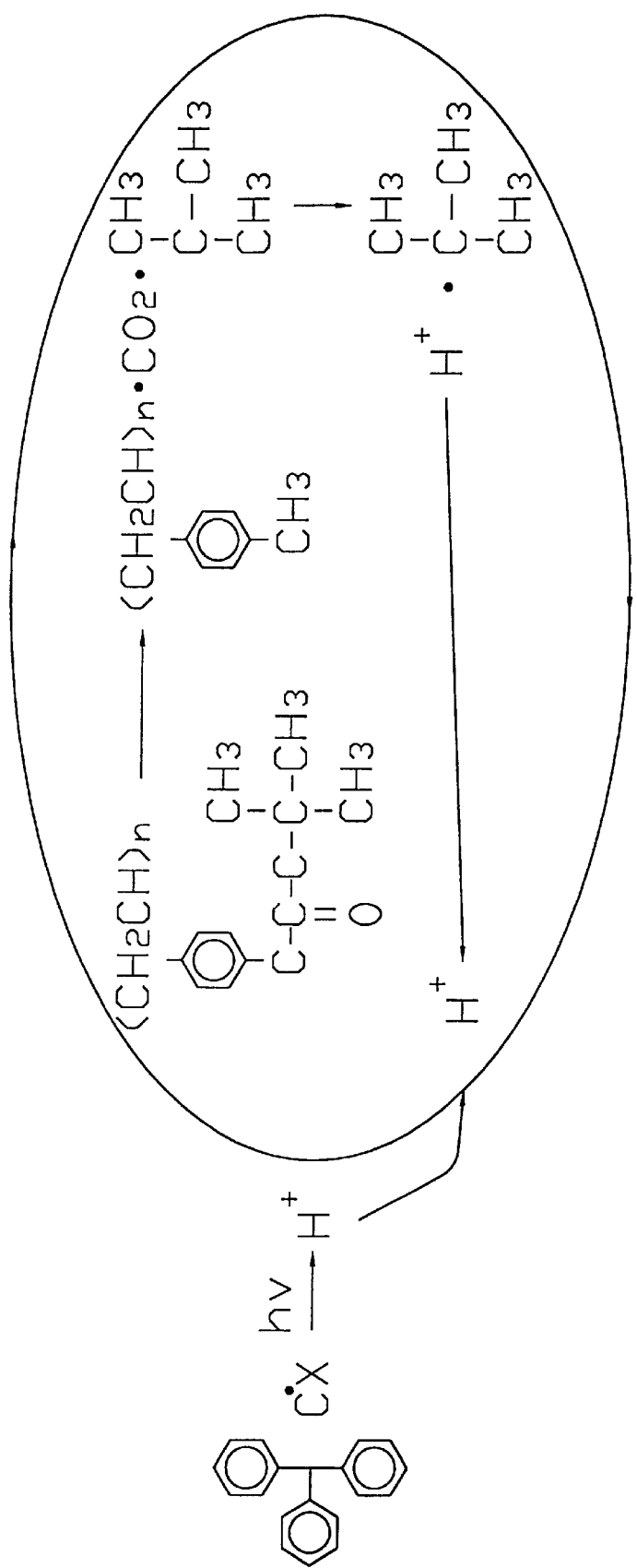
FIG. 4B show equation of the chain reaction of the Lewis acid.
Figure 4C:
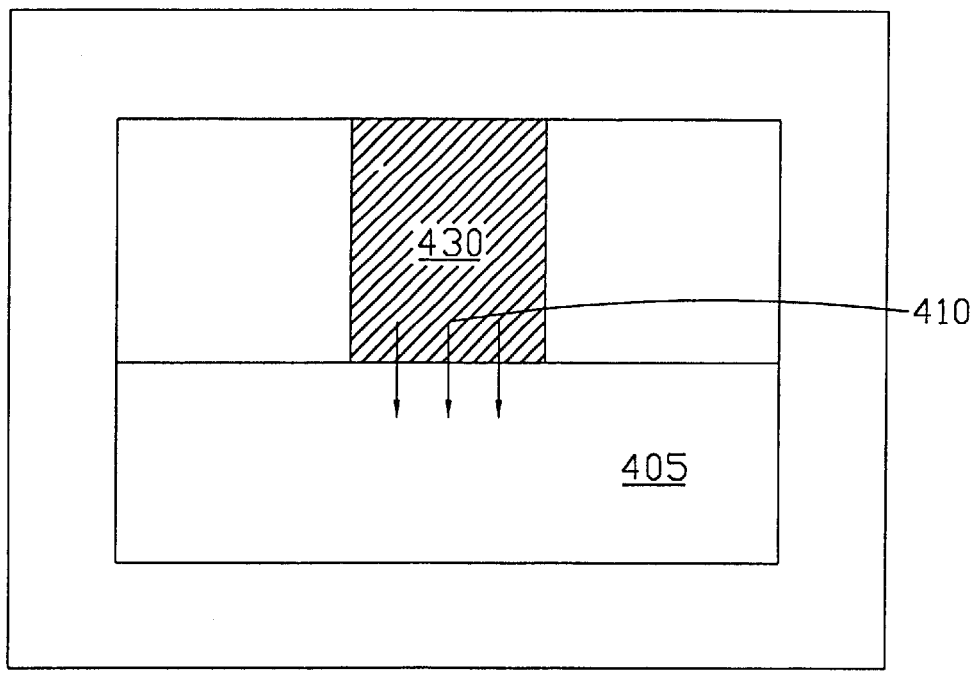
FIG. 4C show cross-sectional views illustrative of the lone pair will trap the proton group.
Figure 4D:
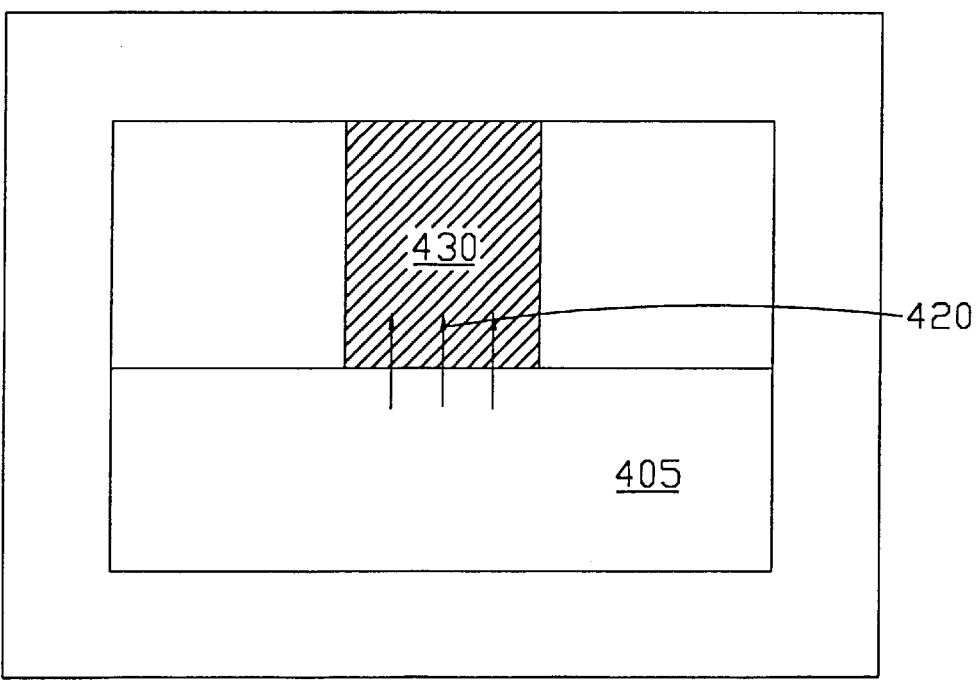
FIG. 4D show cross-sectional views illustrative of the hydroxy ions diffusion to chemically amplified photoresist to quench and stop the catalyst chain reaction.
Figure 4E:
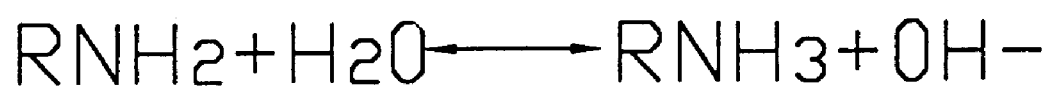
FIG. 4E show illustrative of the structures and the equation of amine and imine.
Figure 4E:
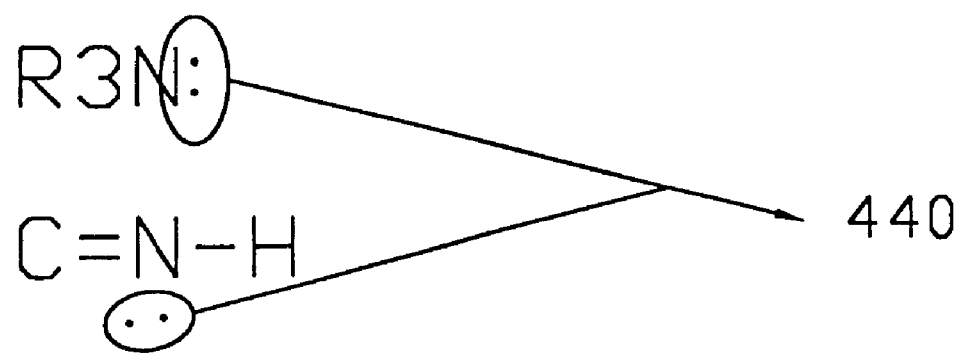
Figure 5A:
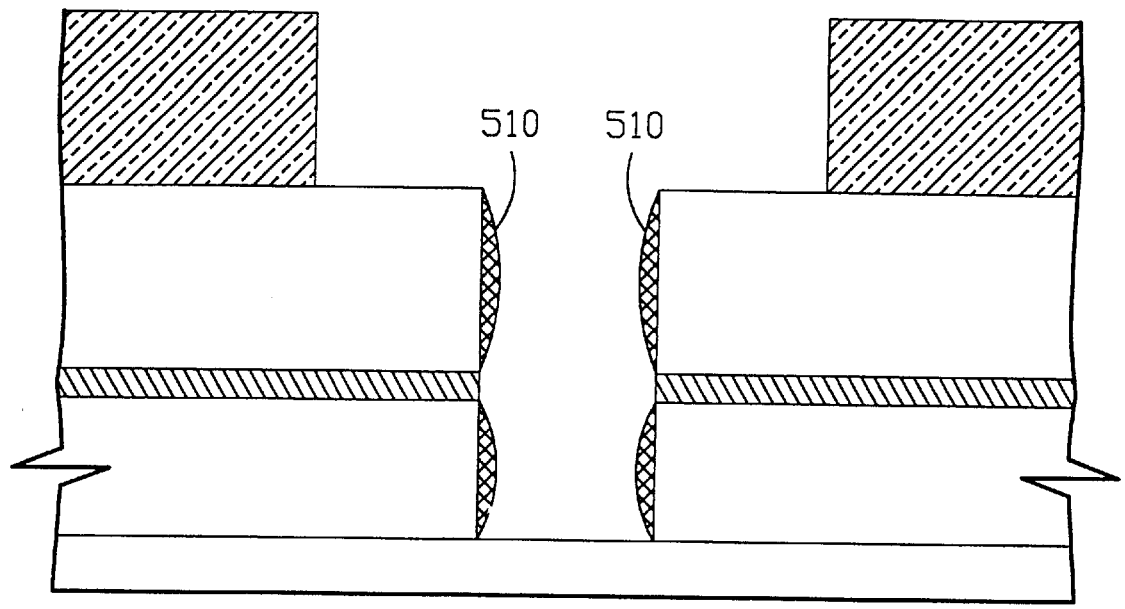
FIGS. 5A to 5B show cross-sectional views illustrative of residue after photoresist patterned.
Figure 5B:
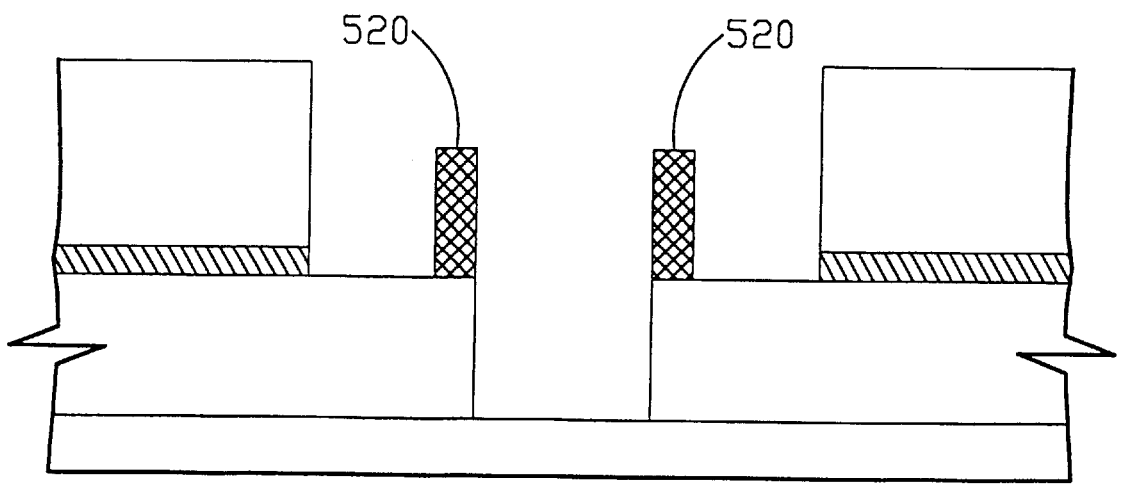

In this embodiment of the present invention, a method for avoiding photo residue on the dual damascene is provided. The image formation is exposure area of photoresist with chain reaction with acid can be dissolved after develpe solution, the chain reaction as shown in FIG. 4B. However, some low-K contain amine, imine, hydroxyimine, tetrahydroxy silane and hydroxy silane etc would have two kind method to absorb $H^+$ ions or diffuse $OH^-$. Referring to FIG. 4C, the lone pair 440 of the amine or imine structure 405 will trap the photon group ($H^+$) 410 or the hydroxy ($OH^-$) ions 420 will diffuse to chemical amplified photoresist 430 to quench and stop the catalyst chain reaction, as shown in FIG. 4D. The reaction will happed as shown in FIG. 4E. The residue appear on exposure area because the photoresist of exposure area can not completely remove without $H^+$ ions after develop. So, the acid treat the surface of the low-K material to satisfy $OH^-$ of diffusion or absorption $H^+$ ions from low-K material. That action can improve $H^+$ ions from photoresist chain reaction could not absorbed or neutralized. The present method is a simply process that is easier to solve above issue than the method that adding gap-filling material on trench or deposit protect material on trench and via. Thus, the method of the present invention can efficiently raise quality of the process. Therefore, the method of the present invention is easily and to conform to the economic effect. Method of the present invention is the best low-K dual damascene compatible process for deep sub-micro process.

Obviously, many modifications and variations of the present invention are possible in light of the above teachings. It is therefore to be understand that within the scope of the appended claims, the present invention may be practiced otherwise than as specifically described herein.

A preferred embodiment of the present invention will now be described in greater detail. Nevertheless, it should be recognized that the present invention can be practiced in a wide range of other embodiments besides those explicitly described, and the scope of the present invention is expressly not limited except as specified in the accompanying claims.

What is claimed is:

1. A method for avoiding photo residue in dual damascene process, comprising:

providing a substrate;

forming a first dielectric layer over said substrate;

forming an etching stop layer over said first dielectric layer;

forming a second dielectric layer over said etching stop layer;

treating surface of said second dielectric layer with a first acid;

forming a first photoresist layer having a first pattern on said treated second dielectric layer;

forming a via hole in said treated second dielectric layer, said etching stop layer and said first dielectric layer;

removing said first photoresist layer;

treating surface of said second dielectric layer and said via hole with a second acid;

forming a second photoresist layer having a second pattern on said second dielectric layer;

forming a trench having larger horizontal size than said via hole in said treated second dielectric layer, said etching stop layer and said first dielectric layer; and removing said second photoresist layer to form an opening of a damascene.

2. The method according to claim 1, wherein said first dielectric layer has a dielectric coefficient less than 3.

3. The method according to claim 1, wherein said second dielectric layer has a dielectric coefficient to be less than 3.

4. The method according to claim 1, wherein said first acid is a Lewis acid that add $H^+$ in solution.

5. The method according to claim 1, wherein the step of forming said via hole comprises proceeding a first etching process by said first photoresist layer as a mask, and punching through in turn said treated second dielectric layer, said etching stop layer and said first dielectric layer.

6. The method according to claim 5, wherein said first etching process is a dry etching method.

7. The method according to claim 1, wherein said second acid is a Lewis acid that add $H^+$ in solution.

8. The method according to claim 1, wherein the step of said second photoresist layer comprises exposing partial surface of said second dielectric layer and said via hole.

9. The method according to claim 1, wherein said trench is formed by said second photoresist layer as a mask to proceed a second etching process and to remove said second dielectric layer until etching to stop on said etching stop layer.

10. The method according to claim 9, wherein said second etching process is a dry etching method.

11. A method for avoiding photo residue in dual damascene process, comprising:

providing a substrate;

forming a first dielectric layer over said substrate;

forming an etching stop layer over said first dielectric layer;

forming a second dielectric layer over said etching stop layer;

treating surface of said second dielectric layer with a first acid;

forming a first photoresist layer having a first pattern on said treated second dielectric layer;

forming a trench in said treated second dielectric layer;

removing said first photoresist layer;

treating surface of said second dielectric layer and said trench with a second acid;

forming a second photoresist layer having a second pattern on said second dielectric layer;

forming a via hole having smaller horizontal size than said trench in said treated second dielectric layer; and removing said second photoresist layer to form an opening of a damascene.

12. The method according to claim 11, wherein said first dielectric layer has a dielectric coefficient less than 3.

13. The method according to claim 11, wherein said second dielectric layer has a dielectric coefficient to be less than 3.

14. The method according to claim 11, wherein said first acid is a Lewis acid that add $H^+$ in solution.

15. The method according to claim 11, wherein said trench is formed by said first photoresist layer as a mask to proceed a first etching process and to remove said treated second dielectric layer until etching to stop on said etching stop layer.

16. The method according to claim 15, wherein said first etching process is a dry etching method.

17. The method according to claim 11, wherein said second acid is a Lewis acid that add $H^+$ in solution.

18. The method according to claim 11, wherein the step of said second photoresist layer comprises exposing partial surface of said second dielectric layer and said trench.

19. The method according to claim 11, wherein the step of forming said via hole by said second photoresist layer as a mask to proceed a second etching process, and punching through in turn said etching stop layer and said first dielectric layer.

20. The method according to claim 19, wherein said second etching process is a dry etching method.

* * * * *